(12) United States Patent
Chai

(10) Patent No.: US 9,482,942 B2
(45) Date of Patent: Nov. 1, 2016

(54) MASK, GLASS SUBSTRATE AND MANUFACTURING METHOD THEREOF

(71) Applicant: Shenzhen China Star Optoelectronics Technology Co., Ltd., Shenzhen, Guangdong (CN)

(72) Inventor: Li Chai, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 131 days.

(21) Appl. No.: 13/985,596

(22) PCT Filed: Jul. 16, 2013

(86) PCT No.: PCT/CN2013/079449
§ 371 (c)(1),
(2) Date: Aug. 15, 2013

(87) PCT Pub. No.: WO2015/000196
PCT Pub. Date: Jan. 8, 2015

(65) Prior Publication Data
US 2015/0017389 A1    Jan. 15, 2015

(51) Int. Cl.
*G03F 1/54* (2012.01)
*B32B 15/08* (2006.01)
*C03C 15/00* (2006.01)
*G03F 1/60* (2012.01)

(52) U.S. Cl.
CPC .............. *G03F 1/54* (2013.01); *C03C 15/00* (2013.01); *G03F 1/60* (2013.01); *C03C 2218/34* (2013.01); *Y10T 428/24479* (2015.01)

(58) Field of Classification Search
CPC .............. G03F 1/32; G03F 1/54; G03F 1/56; G03F 1/58; G03F 1/60; B32B 15/08; B32B 3/26
USPC ....................... 428/156, 172, 457, 212; 430/5
See application file for complete search history.

(56) References Cited

U.S. PATENT DOCUMENTS

| 6,692,878 B2 * | 2/2004 | Tsai et al. ........................ 430/5 |
| 6,790,598 B2 * | 9/2004 | Burke et al. .................. 430/311 |
| 2004/0009413 A1 * | 1/2004 | Lizotte .............................. 430/5 |

FOREIGN PATENT DOCUMENTS

| CN | 1983586 A | 6/2007 |
| CN | 102736323 A | 10/2012 |
| JP | 59135468 A | 1/1986 |
| JP | S62276552 A | 12/1987 |

* cited by examiner

*Primary Examiner* — Joanna Pleszczynska
(74) *Attorney, Agent, or Firm* — Andrew C. Cheng

(57) ABSTRACT

A mask including a light-blocking area, a transparent area and a partial-transparent area is disclosed. The partial-transparent area protrudes from edges of the light-blocking area to admit some of the UV rays to pass through. In addition, a glass substrate and the manufacturing method thereof are disclosed. By arranging the partial-transparent area on the edges of the light-blocking, area, the mask is formed with the slope having the small angle after the lithography process. As such, in the etching process, the edge of the thin film is formed with the slope having the small angle, which contributes to the formation of the second thin film. The thin films are prevented from being fragmented around the slope and the ITO layer is also prevented from fragmented around the periphery of the through hole.

5 Claims, 4 Drawing Sheets

US 9,482,942 B2

MASK, GLASS SUBSTRATE AND MANUFACTURING METHOD THEREOF

BACKGROUND OF THE INVENTION

1. Field of the Invention

The present disclosure relates to liquid crystal display technology, and more particularly to a mask, a glass substrate and the manufacturing method thereof.

2. Discussion of the Related Art

With the advanced technology, demands toward display devices have contributed to a rapid revolution of liquid crystal displays (LCDs). The main targets include improving the quality, reducing the defective rate, and saving the cost.

Currently, the array lithography process has certain requirement regarding the thickness of the photoresist. The thicker photoresist results in high cost, and the thinner photoresist results in a higher risk, i.e., the photoresist film may break off.

FIG. 1 is a partial view of a conventional mask. FIG. 2 is a schematic view showing the mask of FIG 1 after the exposure process and the lithography process. As shown in FIGS. 1 and 2, the mask includes a light-blocking area 11 and a transparent area (not labeled) outside of the light-blocking area 1. By using the mask shown in FIG. 1 to perform the exposure process and the lithography process, a photoresist 21 is formed on the thin film 22 as shown in FIG. 2.

FIG. 3 is a schematic view of the photoresist and the thin film of FIG. 2 after the etching process. By concurrently etching the photoresist 21 and the thin film 22 with the photo-resist peeling method, edges of the thin film 22 are shown as slopes with a large angle. The location 22' may affect the formation of the third thin film and the indium tin oxide (ITO) layer around the through hole. For example, the third thin film may fragment around the slope, and the ITO may also fragment around the periphery of the through hole, which both result in a high defective rate.

SUMMARY

The object of the invention is to provide a mask, a glass substrate and the manufacturing method thereof to solve the above-mentioned problems.

In one aspect, a mask includes: a light-blocking area; a transparent area; a partial-transparent area; and wherein the partial-transparent area protrudes from edges of the light-blocking area to admit some of the UV rays to pass through.

Wherein the mask further comprises a metallic sheet and an organic film, the light-blocking area and the transparent area are formed on the metallic sheet, the organic film adheres to the metallic sheet, and the organic film protrudes from the edges of the light-blocking area with a predetermined width.

Wherein the transmission rate of the organic film is in the ranges of between 10% to 90%, 20% to 80%, 30% to 70%, and 40% to 60%, or the transmission rate of the organic film is 45%, 50%, or 55%.

Wherein the transparent rate of the organic film changes from the edges of the light-blocking area, the change may be a gradual increase, a gradual decrease, or a plurality of gradual increases together with gradual decreases such that the change of the transparent rate looks like a wave-shaped or a sawtooth-shaped transition.

Wherein a dimension of the organic film is larger than the dimension of the light-blocking area, and the organic film fully covers the light-blocking area and also protrudes from the edges of the light-blocking area.

Wherein an engaging frame is arranged between the organic film and the light-blocking area.

Wherein the organic film adheres to an up or a down surface of the metallic sheet.

In another aspect, a manufacturing method of a glass substrate includes cleaning the glass substrate; depositing at least one thin film on the glass substrate; coating photoresist on the glass substrate; applying an exposure process to the glass substrate with a mask comprising a light-blocking area, a transparent area, and a partial-transparent area, and wherein the partial-transparent area protrudes from edges of the light-blocking area to admit some of the UV rays to pass through; applying a lithography process to the glass substrate; applying an etching process to the glass substrate; applying a film-striping process to the glass substrate; and cutting the glass substrate.

In another aspect, a glass substrate includes: an exposed area, an unexposed area, and a partial exposed area extending outward from the edges of the unexposed area, the glass substrate is manufactured by adopting a mask comprising a light-blocking area, a transparent area, and a partial-transparent area, and wherein the partial-transparent area protrudes from edges of the light-blocking area to admit some of the UV rays to pass through.

Wherein after applying a lithography process to the glass substrate, the thickness of the partial exposed area changes from the edges of the unexposed area, the change may be a gradual increase, a gradual decrease, or a plurality of gradual increases together with gradual decreases such that the change of the thickness looks like a wave-shaped or a sawtooth-shaped transition, and when the glass substrate is etched, edges of the thin film is formed as a slope with a small angle.

DETAILED DESCRIPTION OF THE EMBODIMENTS

Embodiments of the invention will now be described more fully hereinafter with reference to the accompanying drawings, in which embodiments of the invention are shown.

Figure 1:
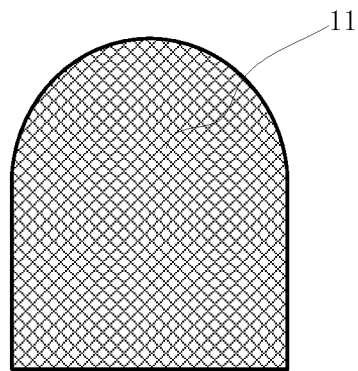
FIG. 1 is a partial view of a conventional mask.
Figure 2:
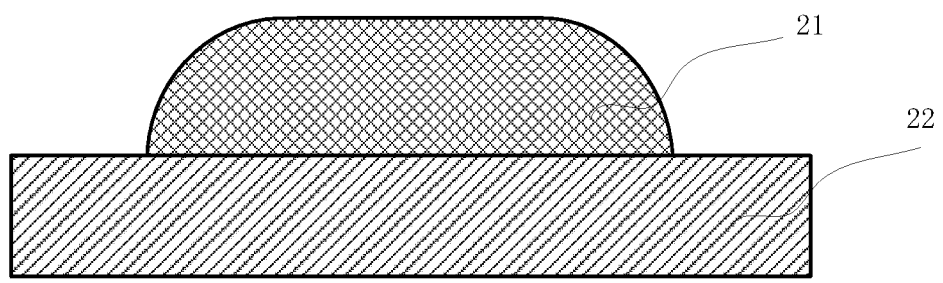
FIG. 2 is a schematic view showing the mask of FIG. 1 after the exposure process and the lithography process.
Figure 3:
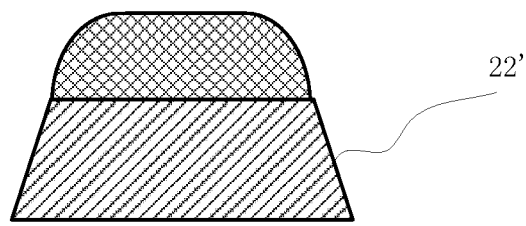
FIG. 3 is a schematic view of the pattern of FIG. 2 after the etching process.
Figure 4:
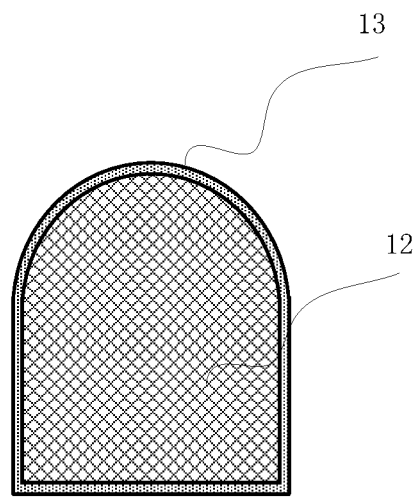
FIG. 4 is a partial view of mask in accordance with one embodiment.

FIG. 4 is a partial view of the mask in accordance with one embodiment. The mask is for blocking ultraviolet (UV) rays in the exposure step of the substrate manufacturing process. The mask includes a light-blocking area 12, a transparent area and a partial-transparent area 13. The partial-transparent area 13 protrudes from edges of the light-blocking area 12 to admit some of the UV rays to pass through. The transparent area (not labeled) is arranged outside the partial-transparent area 13.

Specifically, the mask includes a metallic sheet and an organic film. The light-blocking area 12 and the transparent area are formed on the metallic sheet. The organic film adheres to the metallic sheet. The organic film protrudes from the edges of the light-blocking area 12 with a predetermined width.

In one embodiment, the dimension of the manic film is larger than that of the light-blocking area 12. The organic film fully covers the light-blocking area 12 and also protrudes from the edges of the light-blocking area 12.

In other embodiments, an engaging frame is arranged between the organic film and the light-blocking area 12. The organic film may adhere to an up or a down surface of the metallic sheet.

In one embodiment, the transmission rate of the organic film is in the ranges of between 10% to 90%, 20% to 80%, 30% to 70%, and 40% to 60%. In other embodiments, the transmission rate of the organic film is 45%, 50%, or 55%.

Furthermore, the transparent rate of the organic film changes from the edges of the light-blocking area 12. The change may be a gradual increase, a gradual decrease, or a plurality of gradual increases together with gradual decreases such that the change of the transparent rate looks like a wave-shaped or a sawtooth-shaped transition. With such change, a second thin film can be easily formed on the organic film. In addition, a better friction can be achieved and the second thin film is prevented from being fragmented. Also, the ITO layer is also prevented from being fragmented around the periphery of the through hole so as to improve the defective rate.

Figure 5:
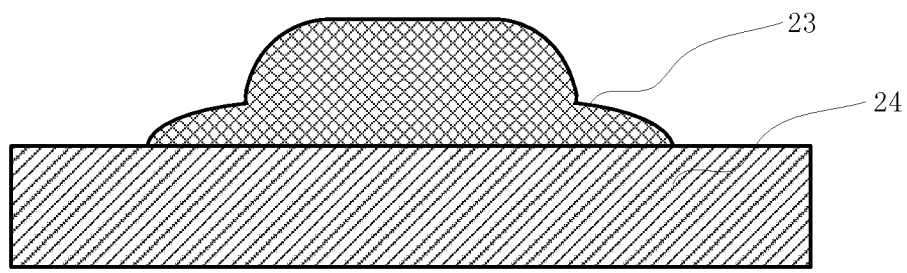
FIG. 5 is a schematic view showing the mask of FIG. 4 after the exposure process and the lithography process.
Figure 6:
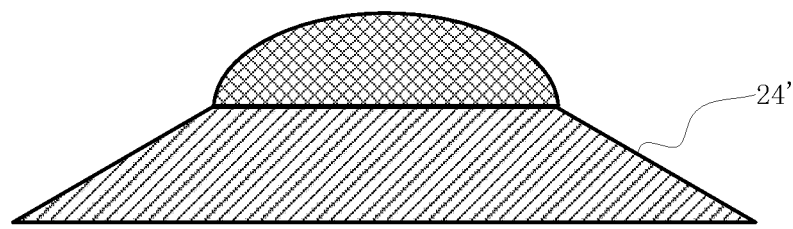
FIG. 6 is a schematic view of the pattern of FIG. 5 after the etching process.

FIG. 5 is a schematic view showing the mask of FIG. 4 after the exposure process and the lithography process. As shown, a photoresist 23 is formed on a thin film 24, FIG. 6 is a schematic view of the pattern of FIG. 5 after the etching process. By adopting the photo-resist peeling method to etch the photoresist 23 and the thin film 24 of FIG. 5, the edges of the thin film 24 is formed with the slope 24' with a small angle. The slope 24' contributes to the formation of a third thin film and the formation of the ITO layer around the periphery of the through hole. Also, the third thin film is prevented from being fragmented around the slope and the ITO layer is prevented from fragmented around the periphery of the through hole.

Figure 7:
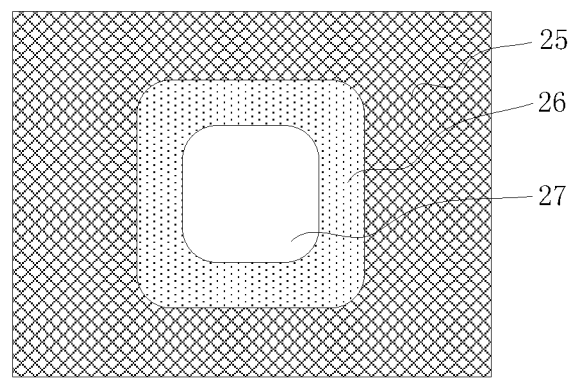
FIG. 7 is a top view of the mask above the through hole in accordance with one embodiment.
Figure 8:
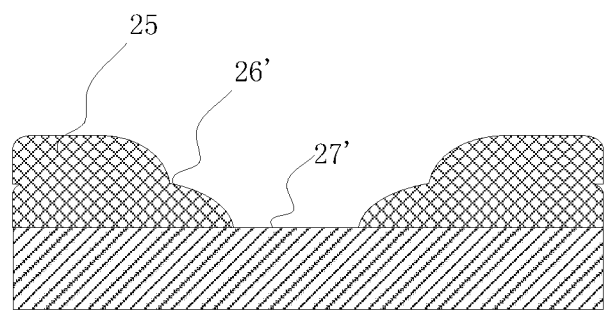
FIG. 8 is a schematic view of the pattern of FIG. 7 after the lithography process.

FIG. 7 is a top view of the mask above the through hole in accordance with one embodiment. FIG. 8 is a schematic view of the pattern of FIG. 7 after the lithography process.

As shown in FIG. 7, after applying the exposure process, an unexposed portion 25, a partial exposed area 26, and an exposed area 27 are formed on the mask.

As shown in FIG. 8, after applying the lithography process, the through hole 27' is formed in the exposed area 27, the slope 26' with a small angle is formed in the partial exposed area 26, and the unexposed area 25 remains the same. In this way, the ITO layer is prevented from being fragmented around the periphery of the through hole 27'.

In one embodiment, the glass substrate manufactured by adopting the above mask in the exposure process includes the exposed area, the unexposed area, and the partial exposed area extending outward from the edges of the unexposed area.

In one embodiment, after applying the lithography process to the glass substrate, the thickness of the partial exposed area changes from the edges of the unexposed area. The change may be a gradual increase, a gradual decrease, or a plurality of gradual increases together with gradual decreases such that the change of the thickness looks like a wave-shaped or a sawtooth-shaped transition. In this way, when the glass substrate is etched, the edges of the thin film is formed as the slope with a small angle.

Figure 9:
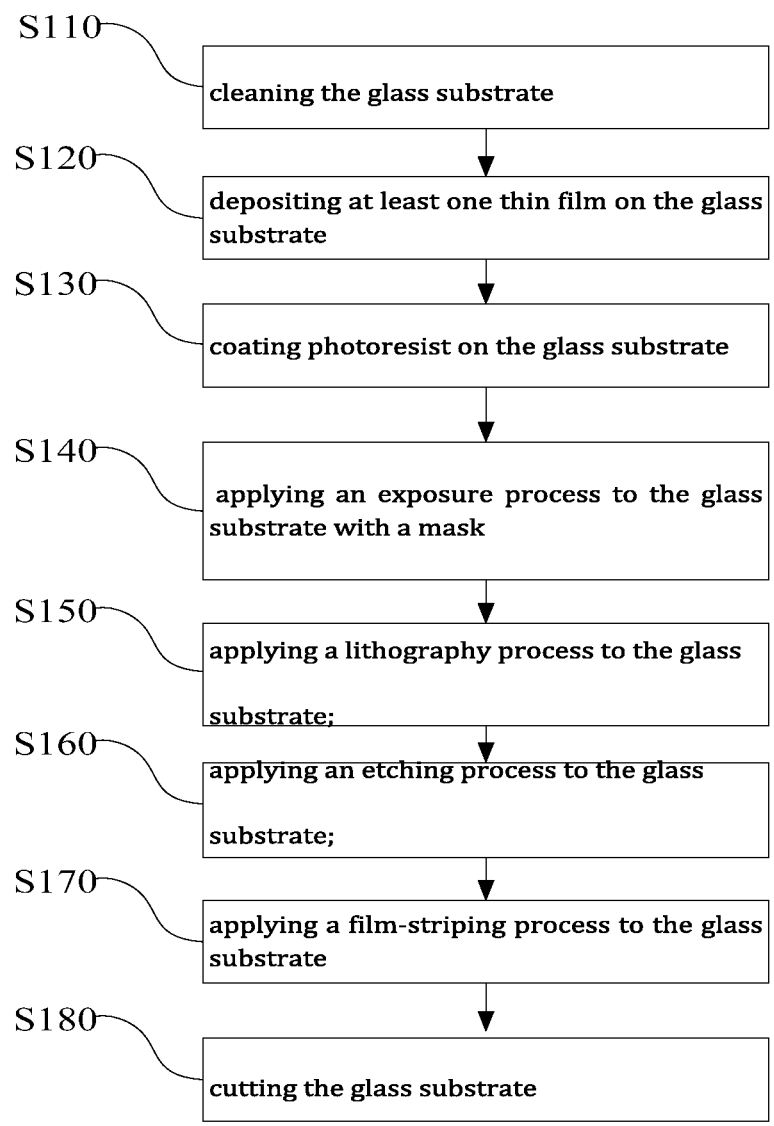
FIG. 9 is a flowchart illustrating the manufacturing method of the glass substrate in accordance with one embodiment.

FIG. 9 is a flowchart illustrating the manufacturing method of the glass substrate in accordance with one embodiment. The method includes the following steps, in step S110, the glass substrate is cleaned. In step S120, the thin films are deposited on the glass substrate.

In step S130, the photoresist is coating on the glass substrate. In step S140, the mask is adopted to perform the exposure process on the glass substrate. In step S150, the lithography process is applied to the glass substrate. In step S160 the etching process is applied to the glass substrate. In step S170, a film-striping process is applied to the glass substrate. In step S180, the glass substrate is cut.

In view of the above, by arranging the partial-transparent area 13 on the edges of the light-blocking area 12, the mask is formed with the slope having the small angle after the lithography process. As such, in the etching process, the edge of the thin film is formed with the slope having the small angle, which contributes to the formation of the second thin film. The thin films are prevented from being fragmented around the slope and the ITO layer is also prevented from fragmented around the periphery of the through hole.

It is believed that the present embodiments and their advantages will be understood from the foregoing description, and it will be apparent that various changes may be made thereto without departing from the spirit and scope of the invention or sacrificing all of its material advantages, the examples hereinbefore described merely being, preferred or exemplary embodiments of the invention.

What is claimed is:

1. A mask, comprising:
  a light-blocking area;
  a transparent area;
  a partial-transparent area; and
  wherein the partial-transparent area protrudes from edges of the light-blocking area to admit some of the UV rays to pass through;
  wherein the mask further comprises a metallic sheet and an organic film, the light-blocking area and the transparent area are formed on the metallic sheet, the organic film adheres to the metallic sheet, and the organic film protrudes from the edges of the light-blocking area with a predetermined width; and
  wherein a dimension of the organic film is larger than the dimension of the light-blocking area, and the organic film fully covers the light-blocking area and also protrudes from the edges of the light-blocking area.

2. The mask as claimed in claim 1, wherein the transmission rate of the organic film is in the ranges of between 10% to 90%, 20% to 80%, 30% to 70%, and 40% to 60%, or the transmission rate of the organic film is 45%, 50%, or 55%.

3. The mask as claimed in claim 2, wherein the transparency rate of the organic film changes from the edges of the light-blocking area, the change may be a gradual increase, gradual decrease, or a plurality of gradual increases together with gradual decreases such that the change of the transparency rate looks like a wave-shaped or a sawtooth-shaped transition.

4. The mask as claimed in claim 1, wherein an engaging frame is arranged between the organic film and the light-blocking area.

5. The mask as claimed in claim 1, wherein the organic film adheres to an upper or a lower surface of the metallic sheet.

\* \* \* \* \*